United States Patent
Liu et al.

(10) Patent No.: US 12,326,657 B2
(45) Date of Patent: Jun. 10, 2025

(54) CHIP DEVIATION CORRECTION METHOD FOR MASKLESS EXPOSURE MACHINE

(71) Applicant: Skybull Technology Co., Ltd., Taichung (TW)

(72) Inventors: Ta Yu Liu, Taichung (TW); Chien Hua Lai, Taichung (TW)

(73) Assignee: SKYBULL TECHNOLOGY CO., LTD., Taichung (TW)

( * ) Notice: Subject to any disclaimer, the term of this patent is extended or adjusted under 35 U.S.C. 154(b) by 590 days.

(21) Appl. No.: 17/842,508

(22) Filed: Jun. 16, 2022

(65) Prior Publication Data

US 2023/0408899 A1  Dec. 21, 2023

(51) Int. Cl.
  *G03F 1/36*  (2012.01)
(52) U.S. Cl.
  CPC ..................... *G03F 1/36* (2013.01)
(58) Field of Classification Search
  CPC ........................................................ G03F 1/36
  USPC ............................................................ 716/53
  See application file for complete search history.

(56) References Cited

U.S. PATENT DOCUMENTS

| | | | | |
|---|---|---|---|---|
| 5,808,354 | A * | 9/1998 | Lee | H01L 24/85 |
| | | | | 257/784 |
| 7,411,287 | B2 * | 8/2008 | Ding | H01L 24/85 |
| | | | | 257/692 |
| 2006/0097387 | A1 * | 5/2006 | Ding | H01L 24/85 |
| | | | | 257/E23.07 |
| 2006/0232288 | A1 * | 10/2006 | Okane | H01L 23/49575 |
| | | | | 257/686 |
| 2008/0179720 | A1 * | 7/2008 | Fan | H01L 23/4951 |
| | | | | 257/E23.039 |

FOREIGN PATENT DOCUMENTS

| | | | | |
|---|---|---|---|---|
| CN | 1800985 B | * | 6/2010 | ............ G03F 1/144 |
| CN | 115084110 B | * | 9/2024 | ............ B81B 7/0006 |
| CN | 115084069 B | * | 2/2025 | ............ B81B 7/0006 |
| JP | 2011222901 A | * | 11/2011 | ............ H01L 24/49 |
| WO | WO-2022188859 A1 | * | 9/2022 | ............ B81B 7/0006 |

* cited by examiner

*Primary Examiner* — Suresh Memula
(74) *Attorney, Agent, or Firm* — Muncy, Geissler, Olds & Lowe, P.C.

(57) ABSTRACT

A chip deviation correction method for maskless exposure machines includes the steps of calculating the bonding positions of chips on a substrate to define the coordinates of the chips on the substrate, creating a separating boundary among the chips according to the coordinates of the chips on the substrate to form plural of bonding areas for accommodating the chips, calculating a lead wire of the chips in the bonding area and a compensating wire which spans across the separating boundary between each lead wire and the lead wire of the corresponding adjacent chip according to the calculated lead wire; and forming a digital exposed layer according to each of the lead wires and each of the compensating wires.

4 Claims, 4 Drawing Sheets

CHIP DEVIATION CORRECTION METHOD FOR MASKLESS EXPOSURE MACHINE

FIELD OF THE INVENTION

The present disclosure relates to photolithography processes, particularly to a chip deviation correction method for maskless exposure machines.

BACKGROUND OF THE INVENTION

In traditional maskless exposure technologies, a photoresist layer is coated onto a wafer, and a digital pattern is used to output and project ultraviolet light with a corresponding pattern onto the wafer, such that the portion of a photoresist layer projected with the ultraviolet light will be melted easily, and then lithography, etching and other relevant processes are performed, and finally the remaining photoresist layer is removed to form a predetermined pattern on the wafer.

However, when the lattice already processed on the wafer is used for die bonding, the chips may not be bonded to the correct positions easily, thereby giving rise to the issue of asymmetry or skewness, and it will be difficult to connect the lead wires, especially for those of the heterogeneous chips of different shapes and sizes. If the lead wires of the heterogeneous chips are connected to each other directly, the lead wires will be contacted and interfered with each other to cause short circuits.

SUMMARY OF THE INVENTION

The primary objective of this disclosure is to provide a chip deviation correction method for maskless exposure machines, which calculates a compensating wire that spans across a separating boundary in order to connect the skewed lead wire of each chip and achieve the effect of correcting the error caused by the deviation of the chips due to die bonding.

To achieve the aforementioned objectives, this disclosure provides a chip deviation correction method for maskless exposure machines, wherein a plurality of chips is combined onto a substrate, and the chips include a plurality of contacts and a lead wire separately formed on the contacts by predetermined exposure, and the method includes the following steps:
  (a) Calculate the positions where the chips are bonded onto the substrate to define the coordinates of the chips on the substrate.
  (b) Create a separating boundary among the chips according to the coordinates of the chips on the substrate to form a plurality of bonding areas for accommodating the corresponding chips respectively.
  (c) Calculate a lead wire of the chips disposed in the bonding area of the chips, and a compensating wire which spans across the separating boundary between each lead wire and the lead wire of the corresponding adjacent chip according to the calculated lead wire.
  (d) Form a digital exposed layer according to each of the lead wires and each of the compensating wires.

In a preferred embodiment, the separating boundary is a virtual line which divides out the bonding areas.

In a preferred embodiment, the separating boundary is a virtual strip area with a predetermined width for dividing out the bonding areas.

In a preferred embodiment, projective geometry is used to calculate the coordinates of the edges and corners of the chips to determine the shape of the chips after deviation and create the separating boundary accordingly, and each of the lead wires and each of the compensating wires are calculated to form the exposed layer.

DESCRIPTION OF THE PREFERRED EMBODIMENTS

Figure 1:
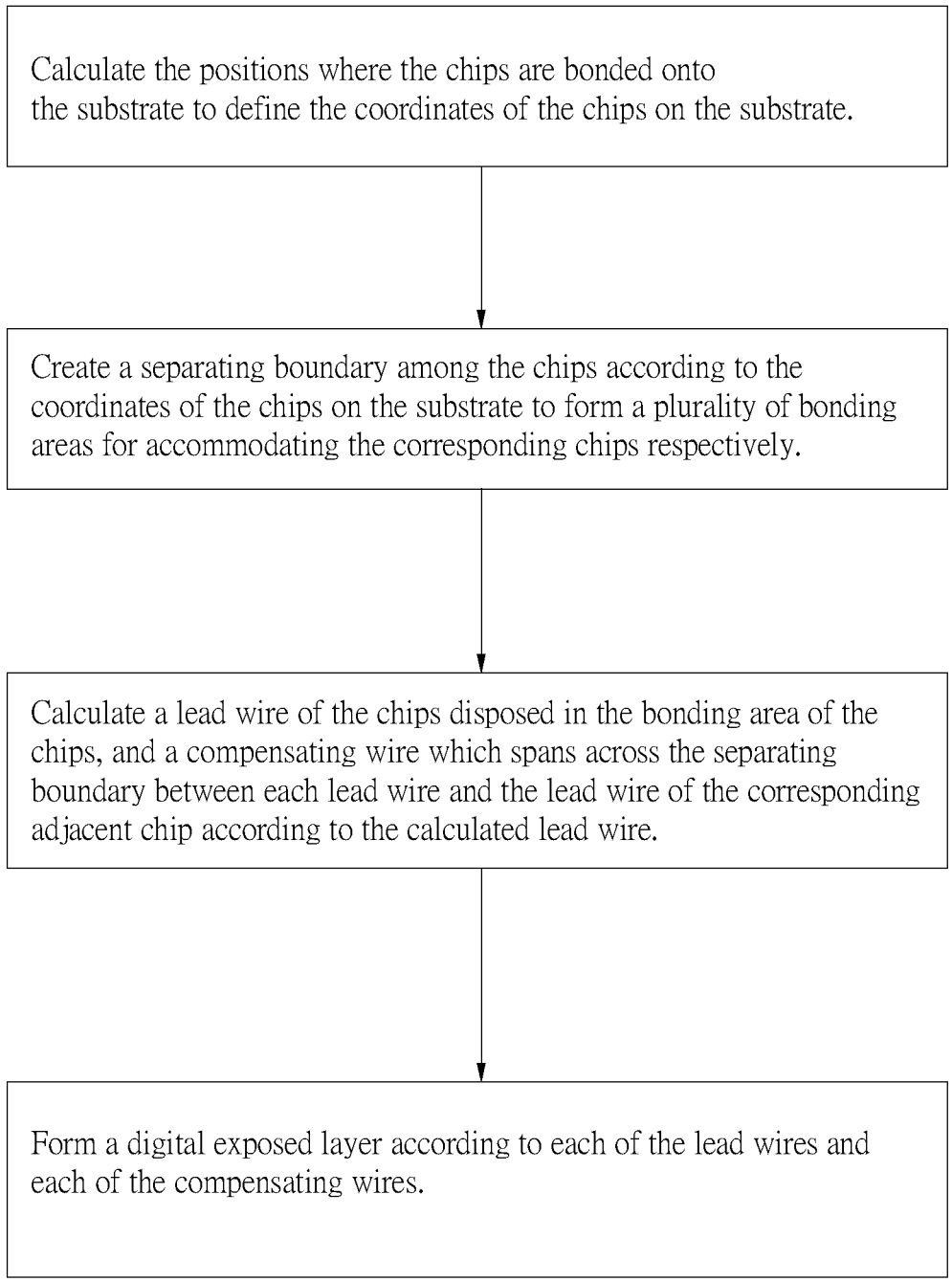
FIG. 1 is a flow chart of this disclosure.
Figure 2:
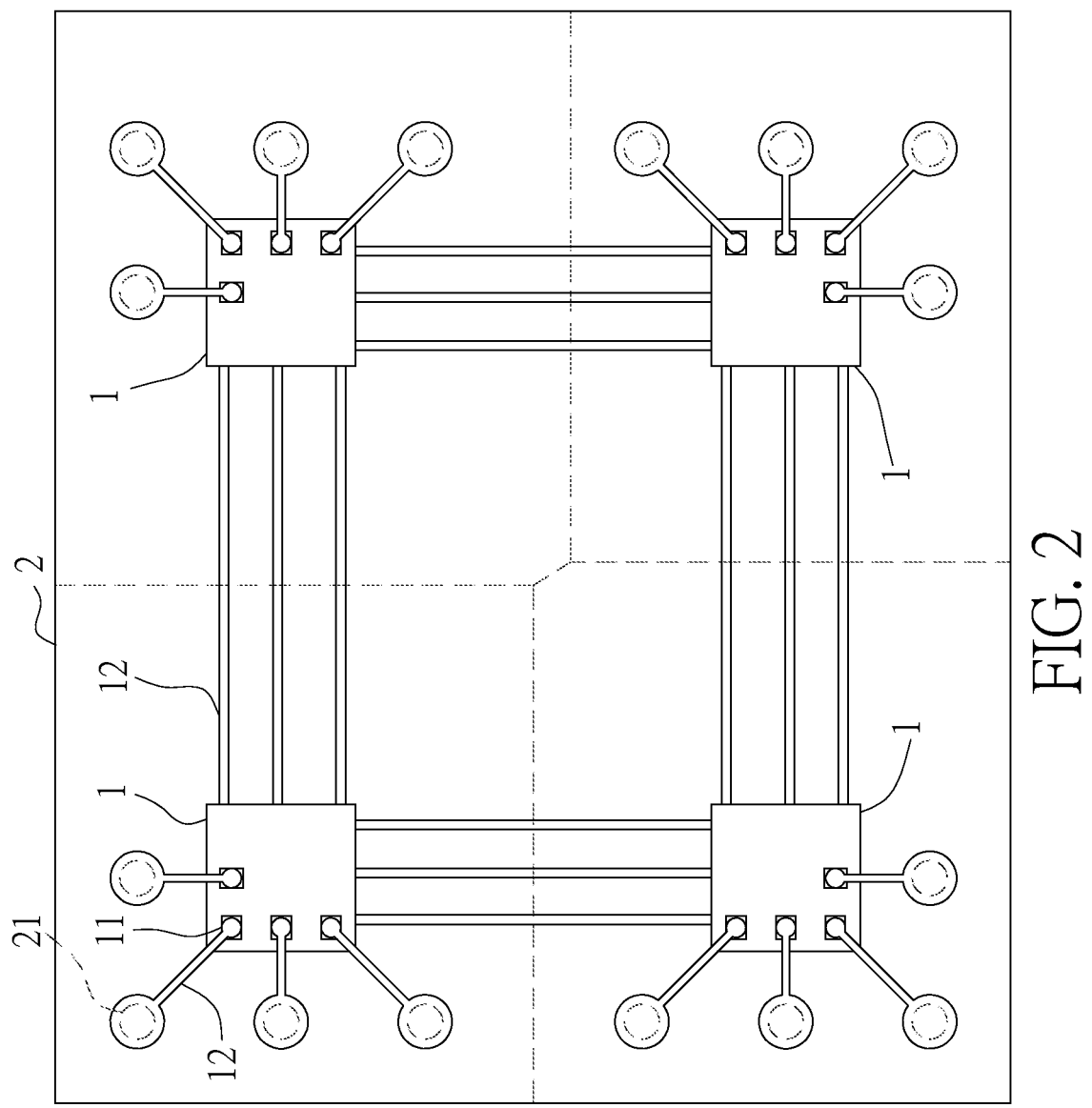
FIG. 2 is a schematic view showing a datum drawing file of this disclosure.
Figure 3:
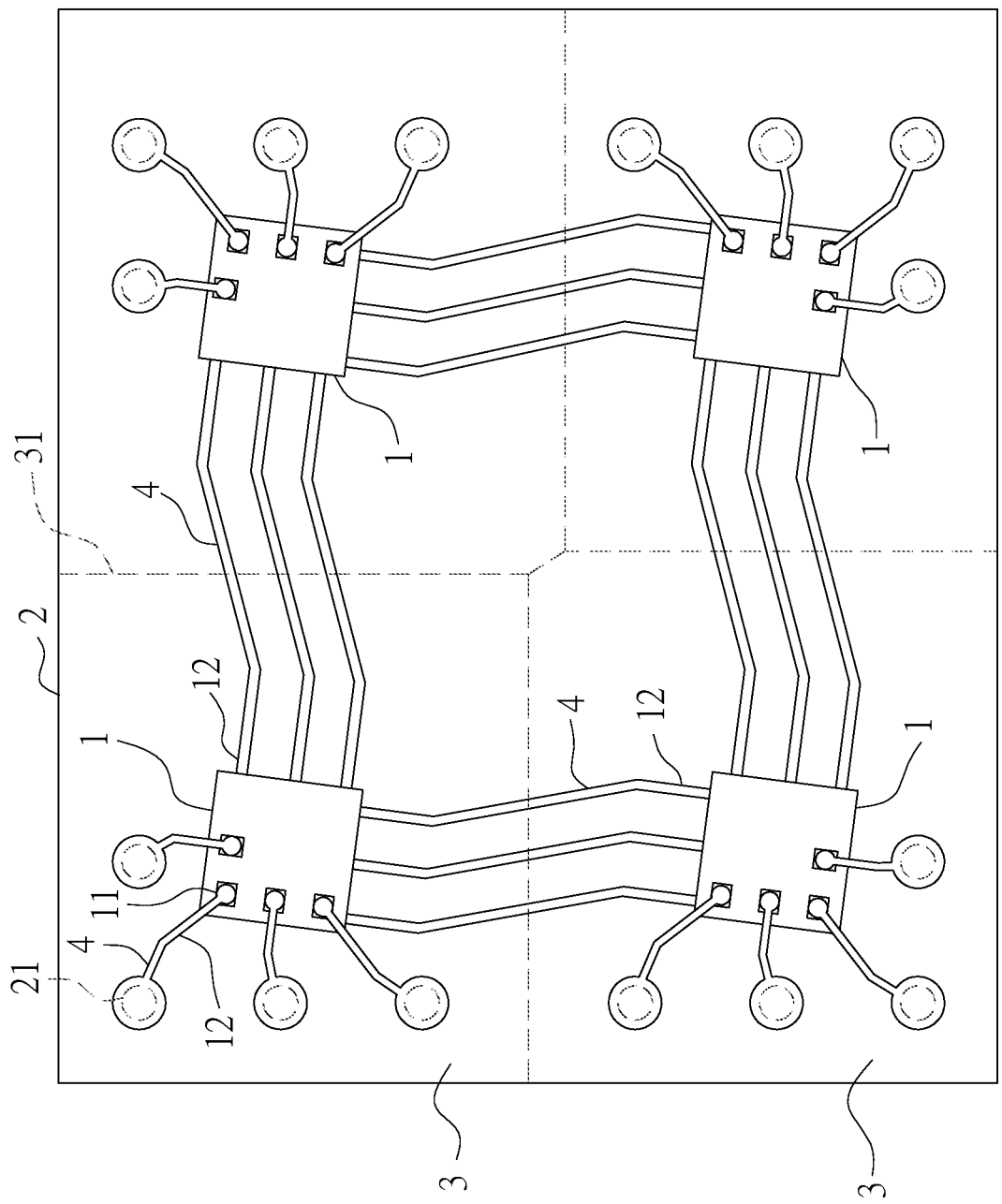
FIG. 3 is a schematic view showing a plurality of separating boundaries of this disclosure, each of which is a virtual line.

With reference to FIGS. 1-3 for a chip deviation correction method for maskless exposure machines in accordance with this disclosure, this method is used to combine a plurality of chips 1 with a substrate 2. FIG. 2 shows a datum drawing file including the chips 1 with the correct shape and position and disposed on the substrate 2. The chips 1 are spaced on the substrate 2 and have a plurality of contacts 11; the substrate 2 has a plurality of connection holes 21; the contacts 11 can be pre-exposed to form a lead wire 12; a portion of the lead wires 12 are extended to the substrate 2 and at a position corresponding to the connection hole 21; and the other portion of the lead wires 12 are connected to the lead wire 12 of the adjacent chip 1.

Since it is inevitable to avoid the issues of asymmetry or skewness caused by the difficulty or failure of bonding the chip 1 to the correct position of the substrate 2, the lead wires 12 between the chips 1 may be deviated or skewed. As a result, a portion of the lead wires 12 cannot be extended to the substrate 2 to the correct positions corresponding to the connection holes 21; and the other portion of the lead wires 12 cannot be connected to the lead wire 12 of the adjacent chip 1 easily.

With reference to FIGS. 1 and 3, FIG. 1 shows the flow chart of a chip deviation correction method for maskless exposure machines in accordance with this disclosure, a pre-scanning means is used to obtain the status information including the shape and position of the chips 1. In this embodiment, the scanning means projects each point in three-dimensional space onto a two-dimensional plane by projective geometry and connects each point projected onto the plane to form a geometric figure. In other words, the bonding position of the edges and end corners of the chips 1 bonded on the substrate 2 is calculated to define the coordinates of the chips 1 on the substrate 2.

The shape and deviation of the chips 1 are detected according to the coordinates of the chips 1 on the substrate 2, and a separating boundary 31 among the chips 1 is created to form a plurality of bonding areas 3 provided for accommodating the corresponding chips 1, wherein the separating boundary 31 is a virtual line.

After the lead wire 12 pre-exposed from the chips 1 and disposed in the bonding area 3 is calculated, a compensating wire 4 spanning across the separating boundary 31 between the lead wire 12 and the lead wire 12 connected to the corresponding adjacent chip 1 is calculated accordingly, and such the compensating wire 4 is connected to each of the lead wires 12 and its corresponding adjacent lead wire 12.

Therefore, the lead wire 12 skewed with the skewness of the chip 1 can be connected from the compensating wire 4 to the lead wire 12 in the corresponding adjacent bonding area 3.

Finally, a digital exposed layer is formed according to each of the lead wires 12 and each of the compensating wires 4, and exposure, lithography, and etching are carried out to form a continuous uninterrupted wiring between the chips 1 in order to produce the required circuit diagram.

Figure 4:
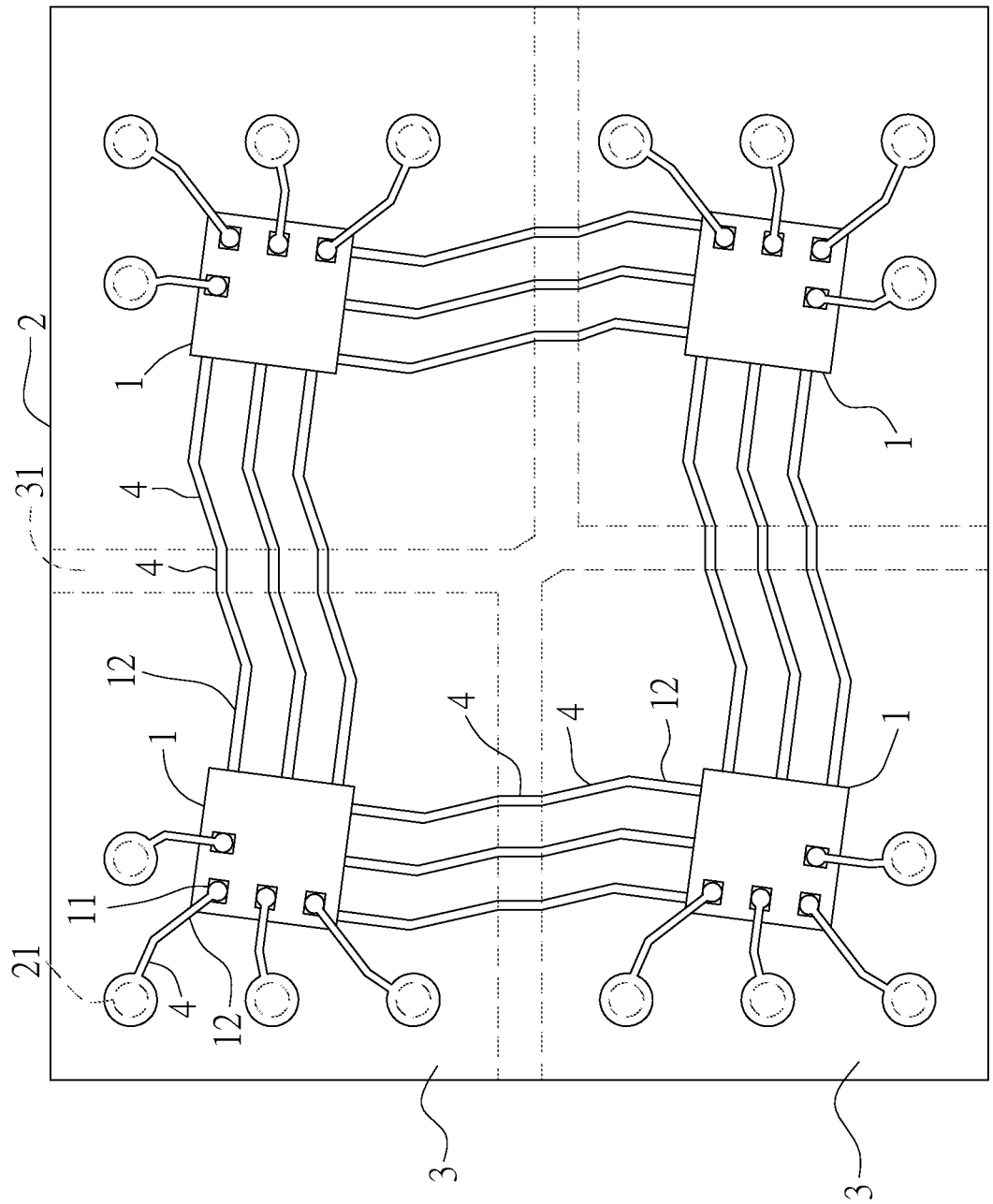
FIG. 4 is a schematic view showing a plurality of separating boundaries of this disclosure, each of which is an image of a virtual strip area

It is noteworthy that the separating boundary 31 as shown in FIG. 4 can be a virtual strip area with a predetermined width, and each of the compensating wires 4 spans vertically across the separating boundary 31, such that the compensating wires 4 in the separating boundary 31 are parallel to each other and have the effect of a whole bunch to prevent the compensating wires 4 from interfering with each other due to the dense configuration caused by the skewed lead wire 12 of each chip 1.

In the method of correcting the deviation of each contact 11, the pre-scanning means is used to obtain the status information including the shape and position of the chips 1, and compare such status information with the datum status information including the correct shape and position of each chip 1 on the substrate 2 in the datum drawing file, and the difference between the two can be obtained after the comparison and then a compensation value for correcting the datum status to the actual shape and position of the chip 1 is calculated, and the compensating wire 4 is calculated according to the compensation value, such that the lead wire 12 as shown in FIG. 3 can be connected to the corresponding position of the connection hole 21 by the compensating wire 4, and a continuous uninterrupted wiring between each contact 11 of the chip 1 and the corresponding connection hole 21 is formed, in order to correct the error caused by the deviation of the contact 11 from the correct position due to die bonding.

By the aforementioned correction method of this disclosure, the skewed wire 12 of each chip 1 can be connected through the compensating wire 4 which spans across the separating boundary 31 to avoid a direct connection with the skewed lead wire 12 and prevent short circuits caused by the mutual contact and interference of the lead wires, so as to achieve the effect of correcting the error caused by the deviation during die bonding.

What is claimed is:

1. A chip deviation correction method for maskless exposure machines, wherein a plurality of chips is combined onto a substrate, and the chips comprise a plurality of contacts and a lead wire separately formed on the contacts by a predetermined exposure, and the method comprising the steps of:
   (a) calculating the positions where the chips are bonded onto the substrate to define the coordinates of the chips on the substrate;
   (b) creating a separating boundary among the chips according to the coordinates of the chips on the substrate to form a plurality of bonding areas for accommodating the corresponding chips respectively;
   (c) calculating a lead wire of the chips disposed in the bonding area thereof, and calculating a compensating wire which spans across the separating boundary between each lead wire and the lead wire of the corresponding adjacent chip according to the calculated lead wire; and
   (d) forming a digital exposed layer according to each of the lead wires and each of the compensating wires.

2. The chip deviation correction method for maskless exposure machines according to claim 1, wherein the separating boundary is a virtual line which divides out the bonding areas.

3. The chip deviation correction method for maskless exposure machines according to claim 1, wherein the separating boundary is a virtual strip area with a predetermined width for dividing out the bonding areas.

4. The chip deviation correction method for maskless exposure machines according to claim 1, further comprising the step of calculating the coordinates of the edges and corners of the chips by projective geometry to determine the shape of the chips after deviation and create the separating boundary accordingly, and calculate each of the lead wires and each of the compensating wires to form the exposed layer.

* * * * *